United States Patent
Limberg (10) Patent No.: US 6,606,129 B1
(45) Date of Patent: Aug. 12, 2003

(54) DIGITAL FILTERING OF DTV I-F SIGNAL TO AVOID LOW-END BOOST OF THE BASEBAND SIGNAL RESULTING FROM IN-PHASE SYNCHRODYNE

(75) Inventor: Allen LeRoy Limberg, Vienna, VA (US)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/431,272

(22) Filed: Nov. 1, 1999

Related U.S. Application Data
(60) Provisional application No. 60/111,016, filed on Dec. 4, 1998.

(51) Int. Cl.[7] .......................... H04N 5/21; H04N 5/213; H04N 5/217; H04N 5/52; H04N 5/44; H04N 5/455; H03H 7/40; H03H 7/30; H04L 27/08

(52) U.S. Cl. ...................... 348/614; 348/607; 348/678; 348/725; 348/726; 348/470; 375/232; 375/233; 375/229; 375/270; 375/345; 375/346

(58) Field of Search .................. 348/614, 607, 348/470, 725–6, 914, 678; 375/232, 233, 346, 345, 270, 321, 285, 229

(56) References Cited

U.S. PATENT DOCUMENTS

| | | | |
|---|---|---|---|
| 4,837,611 A | * 6/1989 | Faroudja | 348/470 |
| 5,103,310 A | * 4/1992 | Gibson et al. | 348/608 |
| 5,175,626 A | * 12/1992 | White | 358/191.1 |
| 5,325,188 A | * 6/1994 | Scarpa | 348/624 |
| 5,623,320 A | * 4/1997 | Rim | 348/614 |
| 5,764,309 A | * 6/1998 | Krishnamurthy et al. | 348/678 |
| 5,835,532 A | * 11/1998 | Strolle et al. | 375/233 |
| 5,973,725 A | * 10/1999 | Lee | 348/21 |
| 5,995,168 A | * 11/1999 | Yagi | 348/725 |
| 6,005,640 A | * 12/1999 | Strolle et al. | 348/726 |
| 6,049,361 A | * 4/2000 | Kim | 348/678 |
| 6,335,762 B1 | * 1/2002 | Lee | 348/558 |
| 6,388,701 B1 | * 5/2002 | Lee | 348/21 |

* cited by examiner

Primary Examiner—John Miller
Assistant Examiner—Paulos Natnael
(74) Attorney, Agent, or Firm—Sughrue Mion, PLLC (57) ABSTRACT

In a radio receiver for digital television signals a digital filter supplies the in-phase synchrodyning circuitry a shaped spectral response to the digitized I-F signal. The amplitude-versus-frequency response of the digital filter rolls off through the carrier region, so that there is substantially no boost of the amplitudes of lower frequency components of the baseband symbol coding recovered by the in-phase synchrodyning circuitry, with respect to the amplitudes of higher frequency components of the baseband symbol coding such circuitry recovers. When the DTV receiver is initially tuned to a channel, the adaptation of the adaptive channel equalizer proceeds without having initially to compensate for the low-end boost.

7 Claims, 6 Drawing Sheets

DIGITAL FILTERING OF DTV I-F SIGNAL TO AVOID LOW-END BOOST OF THE BASEBAND SIGNAL RESULTING FROM IN-PHASE SYNCHRODYNE

This application is filed under 35 U.S.C. 111(a) claiming pursuant to 35 U.S.C. 119(e)(1) benefit of the filing date of provisional application Ser. No. 60/111,016 filed Dec. 4, 1998, pursuant to 35 U.S.C. 111(b).

The invention relates to digital television receivers for vestigial-sideband (VSB) digital television (DTV) signals and, more particularly, to the portions of such receivers used for recovering baseband symbol coding proceeding from intermediate-frequency signals.

BACKGROUND OF THE INVENTION

Bandpass trackers for VSB DTV signal receivers are described by C. B. Patel and the inventor in U.S. Pat. No. 5,479,449 issued Dec. 26, 1995 and entitled "DIGITAL VSB DETECTOR WITH BANDPASS PHASE TRACKER, AS FOR INCLUSION IN AN HDTV RECEIVER". An in-phase synchronous detector synchrodynes digitized VSB DTV signal to baseband for recovering symbol coding. U.S. Pat. No. 5,479,449 describes a narrow bandpass filter being used to convert the digitized VSB DTV signal to a digital narrow-band double-sideband amplitude-modulation (DSB AM) signal. A quadrature-phase synchronous detector synchrodynes the narrow-band DSB AM signal to baseband for recovering an automatic-frequency-and-phase-control (AFPC) signal for a local oscillator that generates local oscillations used in detecting the VSB DTV signal for digitization. U.S. Pat. No. 5,479,449 specifies that the response of the bandpass filter is centered on the carrier wave frequency and is narrow enough in bandwidth that the modulation of the carrier wave is suppressed respective to the carrier wave itself in the response.

U.S. Pat. No. 5,479,449 also describes alternative bandpass trackers for VSB DTV signal receivers which do not use a narrow bandpass filter to convert the digitized VSB DTV signal to a digital narrow-band DSB AM signal, but instead extract AFPC signal for the local oscillator from the response of a narrowband lowpass filter to the quadrature-phase component of the result of complex synchrodyning of the VSB DTV signal to baseband. This alternative type of bandpass tracker has been favored because the narrowband filtering of AFPC signal can be carried out in the analog regime, without employing a digital filter of considerable complexity.

There is a problem with bandpass trackers for VSB DTV signals that arises because the transmitted VSB DTV channel response rolls off in a band of frequencies flanking the carrier, but the transmitted VSB DTV signal does not use a modulation form free of components in a narrow band of frequencies flanking the carrier. This results in asymmetry of the in-phase sidebands near the carrier, so quadrature-phase synchronous detection will not be completely non-responsive to these sidebands. Consequently, very low frequency components of modulation will at times appear in the AFPC signal for the local oscillator that generates local oscillations used in detecting the VSB amplitude modulation to recover baseband symbol coding. The resulting modulation of the frequency and phase of the local oscillator manifests itself as undesirable intersymbol interference in the recovered baseband symbol coding.

U.S. patent application Ser. No. 09/431,272 filed Nov. 1, 1999 and claiming priority from U.S. provisional application Ser. No. 60/111,016 filed Dec. 4, 1998 describes digital filtering of the digitized final I-F signal supplied to the quadrature-phase synchrodyning circuitry for generating AFPC for the local oscillator in the bandpass tracker. This digital filtering reduces the asymmetry of the in-phase sidebands near the carrier to reduce phase jitter in the AFPC loop arising from VSB modulation of the DTV signal. To assure enough vestigial sideband energy to be able to obtain more symmetrical amplitude-modulation sidebands in the region near carrier, and to avoid group delay in this region being excessively non-uniform, the I-F filtering that precedes digitization of the final I-F signal is designed not to roll-off response in the carrier region very much.

Filtering procedures that avoid rolling off the I-F frequency spectrum in the carrier region also affect the response of the in-phase synchrodyning circuitry to the digitized I-F signal, tending to boost the amplitude of components of the recovered baseband symbol coding occurring at low frequencies near zero frequency. This boost is with respect to the amplitude of higher frequency components of the recovered baseband symbol coding. If this tendency is not corrected by other means, the adaptive channel equalizer that is customarily used with the bandpass tracker will act to compensate for this boost.

SUMMARY OF THE INVENTION

The adaptation of the adaptive channel equalizer used with a bandpass tracker is speeded in DTV receivers that embody the invention. In such a DTV receiver a digital filter supplies the in-phase synchrodyning circuitry a shaped spectral response to the digitized I-F signal. The amplitude-versus-frequency response of the digital filter rolls off through the carrier region, so that there is substantially no boost of the amplitudes of lower frequency components of the baseband symbol coding recovered by the in-phase synchrodyning circuitry, with respect to the amplitudes of higher frequency components of the baseband symbol coding such circuitry recovers. When the DTV receiver is initially tuned to a channel, the adaptation of the adaptive channel equalizer proceeds without having initially to compensate for the low-end boost.

The invention is embodied in a radio signal receiver for vestigial sideband digital television signals, which receiver is of the following sort. The radio signal receiver includes a tuner for converting the vestigial-sideband amplitude modulation of a selected digital radio signal to an analog intermediate-frequency signal. The radio signal receiver includes analog-to-digital conversion circuitry for converting the analog intermediate-frequency signal to a digitized intermediate-frequency signal, a digital filter for generating a shaped spectral response to the digitized intermediate-frequency signal, and in-phase synchrodyning circuitry for demodulating the digitized intermediate-frequency signal to recover baseband symbol coding. The radio signal receiver includes adaptive baseband equalization and ghost-cancellation filtering responsive to the baseband symbol coding recovered by the in-phase synchrodyning circuitry. In accordance with the invention, the shaped spectral response of the digital filter is designed to improve the flatness of amplitude response and uniformity of group delay of components of the baseband symbol coding that are close to zero frequency. This relieves the adaptive baseband equalization and ghost-cancellation filtering from having to provide such improvements.

DETAILED DESCRIPTION

At various points in the circuits shown in the FIGS. of the drawing, shimming delays have to be inserted in order that the sequence of operation is correct, as will be understood by those skilled in electronic design. Unless there is something extraordinary about a particular shimming delay requirement, it will not be explicitly referred to in the specification that follows.

Figure 1:
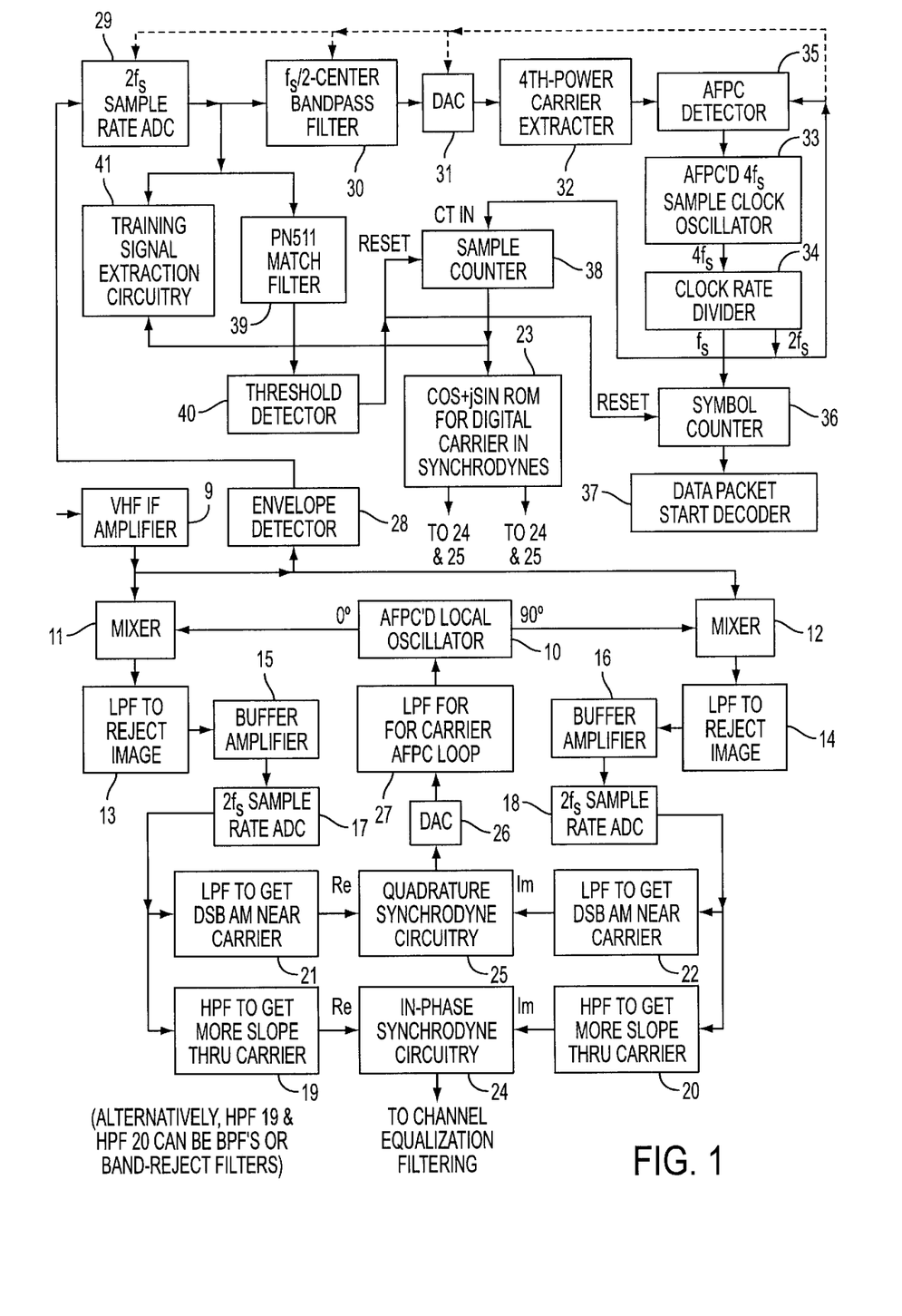
FIG. 1 is a block schematic diagram of portions of a vestigial-sideband digital television receiver embodying the invention, which VSB DTV receiver portions generate a complex final intermediate-frequency signal with a carrier at the lower end of its frequency spectrum, which final I-F signal is digitized by complex analog-to-digital conversion circuitry and is subsequently demodulated in the digital regime.

FIG. 1 shows portions of a VSB DTV receiver operated with a sampling clock of a frequency $2f_S$, which is twice the 10.76 Mhz symbol frequency $f_S$ used in the received VSB DTV signals. A VSB DTV signal received over a transmission channel in the ultra-high-frequency (UHF) band typically is superheterodyned to UHF intermediate-frequency signal in an initial upconversion. Surface-acoustic-wave (SAW) filtering on gallium-arsenide substrates facilitates the suppression of adjacent channel signals. The SAW filter response is usually downconverted to a very-high-frequency intermediate-frequency signal. FIG. 1 shows a very-high-frequency intermediate-frequency amplifier 9 receiving this VHF I-F signal as input signal. The VHF I-F-amplifier 9 contains a number of automatic-gain-controlled amplifier stages and supplies an output signal of controlled amplitude to a first mixer 11 and to a second mixer 12 for downconversion to a complex signal in a medium- and high-frequency band in the range of one to ten megahertz. A local oscillator 10 supplies an in-phase carrier at a frequency somewhat above the VHF I-F band to the first mixer 11 and a quadrature-phase carrier of the same frequency to the second mixer 12 for implementing this complex downconversion of the VHF I-F amplifier 9 output signal. The frequency and phase of the oscillations from this local oscillator 10 are subject to automatic frequency and phase control (AFPC). The AFPC of the oscillator 10 implements sampling of the VHF I-F signal at prescribed phases of the carrier when digitizing that VHF I-F signal.

Lowpass analog filters 13 and 14 select the components of this complex final intermediate-frequency signal from the output signals of the mixers 11 and 12, but suppress the image components in the complex signal. Buffer amplifiers 15 and 16 supply output signals to analog-to-digital converters 17 and 18 in response to the output signals of the filters 13 and 14. The ADCs 17 and 18 sample at the rate $2f_S$ twice the symbol rate $f_S$ and digitize the complex final I-F signal. It is presumed that the carrier of the VSB DTV signal appears in the lower frequencies of the complex final I-F signal supplied from the ADCs 17 and 18 in the FIGURE portions of a DTV receiver. A carrier frequency of 2.69 megahertz (one-quarter symbol rate) or of 1.345 megahertz (one-eighth symbol rate) is convenient to use, by way of specific example, since a digital carrier that is a submultiple of symbol rate is quite readily synthesized from read-only memory (ROM) in the DTV receiver.

The digitized real and imaginary components of the complex final I-F signal supplied from the ADCs 17 and 18 are supplied to finite-impulse-response highpass digital filters 19 and 20, which are similar to each other in their construction and which cut off the frequency responses to these components near and below carrier frequency in preparation for synchrodyning them to baseband for recovering baseband symbol code. In accordance with the invention, the FIR digital highpass filters 19 and 20 supply a complex final I-F signal for demodulation, the real and imaginary components of which signal exhibit similar system characteristics with responses that are 3 dB down at final I-F carrier frequency.

The filters 19 and 20 can alternatively be designed as bandpass filters that have responses with Nyquist slope roll-offs that are 3 dB down at 5.38 MHz above final I-F carrier frequency. The advantage of doing this is that the positioning of the Nyquist slope vis-a-vis carrier frequency in the digital filters 19 and 20 causes Nyquist slope filtering to track the carrier frequency controlled by the bandpass tracker arrangement of the AFPC'd local oscillator 10. If the Nyquist slope roll-offs are developed earlier in the DTV receiver, their positioning vis-a-vis carrier frequency is subject to change somewhat with receiver tuning.

However, the filters 19 and 20 can be designed with fewer weighting coefficients if they are highpass filters. Such design is possible if the Nyquist slope roll-offs are developed earlier in the DTV receiver, for example. The VHF I-F amplifier 9 can include a surface-acoustic-wave (SAW) filter that provides a Nyquist slope roll-off that is 3 dB down at 5.38 MHz remove from VHF I-F carrier frequency, for example. In designing a SAW filter for shaping the VHF I-F amplifier 9 passband, it is preferable that the pilot carrier not be attenuated by the I-F roll-off for rejecting carrier-side adjacent-channel signal, particularly adjacent-channel NTSC sound. This better maintains the pilot carrier larger than noise during digitization in the ADCs 17 and 18, better to avoid jitter in the AFPC loop.

The DTV receiver design practice that is generally followed at the current time employs baseband channel-equalization filtering of demodulated DTV signals before they are subjected to symbol decoding procedures, such as trellis coding, etc. The inventor prefers to develop the Nyquist slope roll-off in the baseband channel-equalization filtering if such be employed.

The digitized real and imaginary components of the complex final I-F signal supplied from the ADCs 17 and 18 are supplied to digital filters 21 and 22, which generate responses to these components in which the amplitude-modulation sidebands are symmetrical around the carrier, over a frequency band wider than the lock in range of the APFC loop. That is, the modulation near carrier is double-sideband amplitude modulation (DSB AM), so the responses to the upper and lower sidebands near carrier will cancel when quadrature-phase synchrodyning of the complex final I-F signal to baseband is done for recovering signal from which to extract AFPC signal for the local oscillator 10. Since the portions of a DTV receiver shown in FIG. 1 are designed to have the carrier of the VSB DTV signal appear in the lower frequencies of the complex final I-F signal supplied from the ADCs 17 and 18, the digital filters 21 and 22 are lowpass finite-impulse-response digital filters, similar in their construction.

The complex digital carrier used for synchrodyning to baseband in the digital regime is supplied from a read-only memory 23 to in-phase synchrodyne circuitry 24 and to quadrature-phase synchrodyne circuitry 25. The in-phase synchrodyne circuitry 24 is a complex digital multiplier that multiplies the responses of digital filters 19 and 20, received as complex multiplicand input signal, by the complex digital carrier, received from the ROM 23 as complex multiplier input signal. This recovers baseband symbol code as the real component of the product output signal. This baseband symbol code is forwarded to baseband channel-equalization and ghost-cancellation filter circuitry (e. g., of the type shown in FIG. 3). Since the imaginary component of the product output signal from this complex digital multiplier is not used anyway, the component digital multipliers and digital subtractor that would be used to generate the imaginary component of the product output signal are preferably omitted from the in-phase synchrodyne circuitry 24. For the sake of fast processing, the component digital multipliers and digital adder that are used to generate the real component of the product output signal are preferably replaced by read-only memory (ROM) storing an appropriate look-up table.

The quadrature-phase synchrodyne circuitry 25 is a further complex digital multiplier. This further complex digital multiplier multiplies the responses of digital filters 21 and 22, received as complex multiplicand input signal, by complex digital carrier, received from the ROM 23 as complex multiplier input signal. This recovers a further product output signal, from an imaginary component of which further product output signal automatic frequency and phase control (AFPC) signal for the local oscillator 10 is extracted. Since the real component of the product output signal from this complex digital multiplier is unnecessary, the component digital multipliers arid digital adder that would be used to generate the real component of the product output signal are preferably omitted from the quadrature-phase synchrodyne circuitry 25. For the sake of fast processing, the component digital multipliers and digital subtractor that are used to generate the imaginary component of the product output signal are preferably replaced by ROM storing an appropriate look-up table. Embodiments of the invention in which the ROM is addressed not by complex digital carrier but by the less significant bits of symbol count are also possible.

The digital output signal of the quadrature-phase synchrodyne circuitry 25, corresponding to the imaginary component of the further product output signal is supplied to a digital-to-analog converter 26 for conversion to an analog signal applied as input signal to a lowpass analog filter 27. The response of the lowpass analog filter 27 is supplied to the local oscillator 10 as its automatic frequency and phase control (AFPC) signal. The AFPC signal is operative to adjust the frequency and phase of the oscillations of the local oscillator 10 to zero the imaginary output signal from the quadrature-phase synchrodyne circuitry 25. This maximizes the direct component of the real output signal from the in-phase synchrodyne circuitry 24, presuming the respective complex multiplications carried out in the in-phase synchrodyne circuitry 24 and in the quadrature-phase synchrodyne circuitry 25 are performed contemporaneously, with suitably timed respective multiplicand input signals and suitably timed respective multiplier input signals. The latencies of the filters 21 and 22 should be the same as the latencies of the filters 19 and 20, with delay shimming being done if this is not the case. Offsetting the complex digital carriers supplied from the ROM 23 to the in-phase synchrodyne circuitry 24 and the quadrature-phase synchrodyne circuitry 25 is a possible alternative, but is not preferred because the hardware requirement in ROM 23 is increased.

In order that the bandpass tracker apparatus can automatically sample at a prescribed carrier phasing when digitizing VSB I-F signal, synchronization of the sampling circuitry to symbol rate of received VSB DTV signal is done independently of the bandpass tracker apparatus. Such synchronization can be achieved using the spectral line method for passband signals, sometimes referred to as "envelope derived timing". FIG. 1 shows apparatus for implementing a preferred spectral line method. An envelope detector 28 is used for detecting the envelope variations of the VHF I-F signal supplied from the VHF I-F amplifier 9. Detecting the envelope variations of the VHF I-F signal, rather than the envelope variations of the final I-F signal in the low- and medium-frequency band, simplifies the filtering to suppress carrier remnants in the envelope detector output signal. An analog-to-digital converter 29 samples the envelope detector output signal at the rate $2f_S$ twice the symbol rate $f_S$, to generate input signal for an FIR digital bandpass filter 30. The digital bandpass filter 30 has a passband centered at $f_S/2$ for extracting a spectral line near 5.38 MHz. The 2 s sample rate in the ADC 29 samples the $f_S/2$ spectral line component four times per cycle so that complete phase information is preserved in the digital samples that the FIR digital bandpass filter 30 supplies to a digital-to-analog converter 31. The analog output signal from the DAC 31 containing the $f_S/2$ spectral line selected by the digital bandpass filter 30 is supplied to a non-linear circuit 32 that generates an output signal that is the fourth power of that spectral line. By way of example, the non-linear circuit 32 comprises a cascade of two analog squaring circuits with respective resistance-coupled output ports; several equivalents are known in the art.

A sample clock oscillator 33 oscillates at $4f_S$ and supplies its. oscillations to a clock rate divider network 34 that generates sampling clock signals at $f_S$ sample rate and $2f_S$ sample rate. An automatic frequency and phase detector 35 applies automatic frequency and phase (AFPC) signal to the sample clock oscillator 33 for synchronizing its oscillations with symbols of the currently received VSB DTV signal.

More particularly, $2f_S$ sample rate signal from the clock rate divider network 34 is supplied to the AFPC detector 35 for comparison with the non-linear circuit 32 output signal. The non-linear circuit 32 output signal is a $2f_S$ signal that is the fourth power of the $f_S/2$ spectral line selected by the digital bandpass filter 30. The AFPC loop comprising elements 33, 34 and 35 locks the $2f_S$ sample rate signal from the clock rate divider network 34 in quadrature phase with the $2f_S$ output signal from the non-linear circuit 32.

A novel feature in the spectral line separation employed in FIG. 1 is the use of the FIR digital bandpass filter 30 for selecting the $f_S/2$ spectral line, rather than the analog bandpass filter used in the prior art. The FIR digital bandpass filter 30 is a tracking filter, since the center frequency of its passband is determined by the frequency of the sample clock oscillator 33 oscillations. The sample clock oscillator 33 is a stable oscillator, typically being crystal stabilized, and its AFPC range is small enough to avoid phase locking to the $f_S/3$ or $f_S/4$ spectral line in the envelope detector output signal. The use of an FIR digital bandpass filter 30 eliminates the phase shifting close to $f_S/2$ spectral line that is a problem with a narrowband analog bandpass filter. The digital-to-analog conversion of the digital bandpass filter 30 response avoids having to sample at more than $2f_S$ sample rate. If harmonics of the $f_S/2$ spectral line are generated in the digital regime, higher sampling rate is required in order not to undersample the harmonic components. Alternative designs are possible in which the clock rate divider network 34 is modified to generate sampling clock signals at $f_S/2$ sample rate to be compared with the $f_S/2$ spectral line in the DAC 31 output signal in a modified AFPC detector 35. However, care must be taken to forestall jitter between the sampling clock signals which tends to arise in the chain of flip-flops used in the clock rate divider network 34. Ripple carry should be avoided in favor of clocked state transitions, for example.

Synchronization using the spectral line method for passband signals is not readily compatible with synchronization using data segment synchronization (DSS) codes as described by R. W. Citta, D. M. Mutzabaugh and G. J. Sgrignoli in U.S. Pat. No. 5,416,524 issued May 16, 1995 and entitled "DIGITAL TELEVISION SYNCHRONIZATION SYSTEM AND METHOD". In U.S. Pat. No. 5,602,595 issued Feb. 11, 1997 and entitled "ATV/MPEG SYNC SYSTEM" R. W. Citta, M. Fimoff and T. G. Laud describe the detection of DSS codes for signaling the ends of MPEG-II data packets. The DSS codes are unnecessary overhead when the spectral line method for passband signals is used for synchronization. The $f_S$ sample rate signal from the clock rate divider network 34 is supplied to a symbol counter 36 for counting the symbols in a prescribed number of data fields. The count from the symbol counter 36 is decoded by data packet start decoders 37 for determining the starts of data packets, such as MPEG-II data packets. This decoding is facilitated by the counter stages that determine the less significant bits of the symbol counter 36 count being arranged to count modulo-832 and the counter stages that determine the more significant bits of the symbol counter 36 count being arranged to count data segments.

The $2f_S$ sample rate signal from the clock rate divider network 34 is supplied to a sample counter 38 for counting the $2f_S$ rate samples in a prescribed number of data fields. Less significant bits of the count are used to address the ROM 23 that generates the complex digital carrier supplied to the synchrodyne circuitry 24 as its multiplier input signal and supplied to the synchrodyne circuitry 25 as its multiplier input signal. If the final I-F carrier frequency is suitably chosen modifications of the FIG. 1 circuitry that dispense with the symbol counter 36 are possible. In such modified circuitry the more significant bits of the sample count supplied from the sample counter 38 at sample rate are used to provide symbol count at $f_S$ rate. The symbol count at $f_S$ rate is obtainable from the sample counter 38 counting at $2f_S$ sample rate by discarding the least significant bit from the sample count.

FIG. 1 shows the envelope detector 28 response as digitized at $2f_S$ sample rate by the ADC 29 being supplied as input signal to a PN511 match filter 39. When a PN511 sequence occurs in the initial data segment of a data field, unless there is too much interfering noise the PN511 match filter 39 response will become large enough to be detected by a threshold detector 40 thereby generating a reset command for the counters 36 and 38. The counters 36 and 38 are designed to continue counting until such a reset command is supplied even if that takes a few data fields. The counters 36 and 38 are preferably designed to count samples for a plurality of data frames before the count rolls over, to implement the operation of training signal extraction circuitry 41.

The envelope detector 28 response as digitized at $2f_S$ sample rate by the ADC 29 is applied to the training signal extraction circuitry 41 as its input signal. The training signal extraction circuitry 41 is conditioned by certain sample counts from the sample counter 38 to extract training signal for the channel equalization filtering from the data field synchronization codes in the initial data segments of data fields. Accumulation of training signal samples over a cycle of six data fields or a plurality of such cycles helps suppress artifacts of NTSC co-channel interference.

Figure 2:
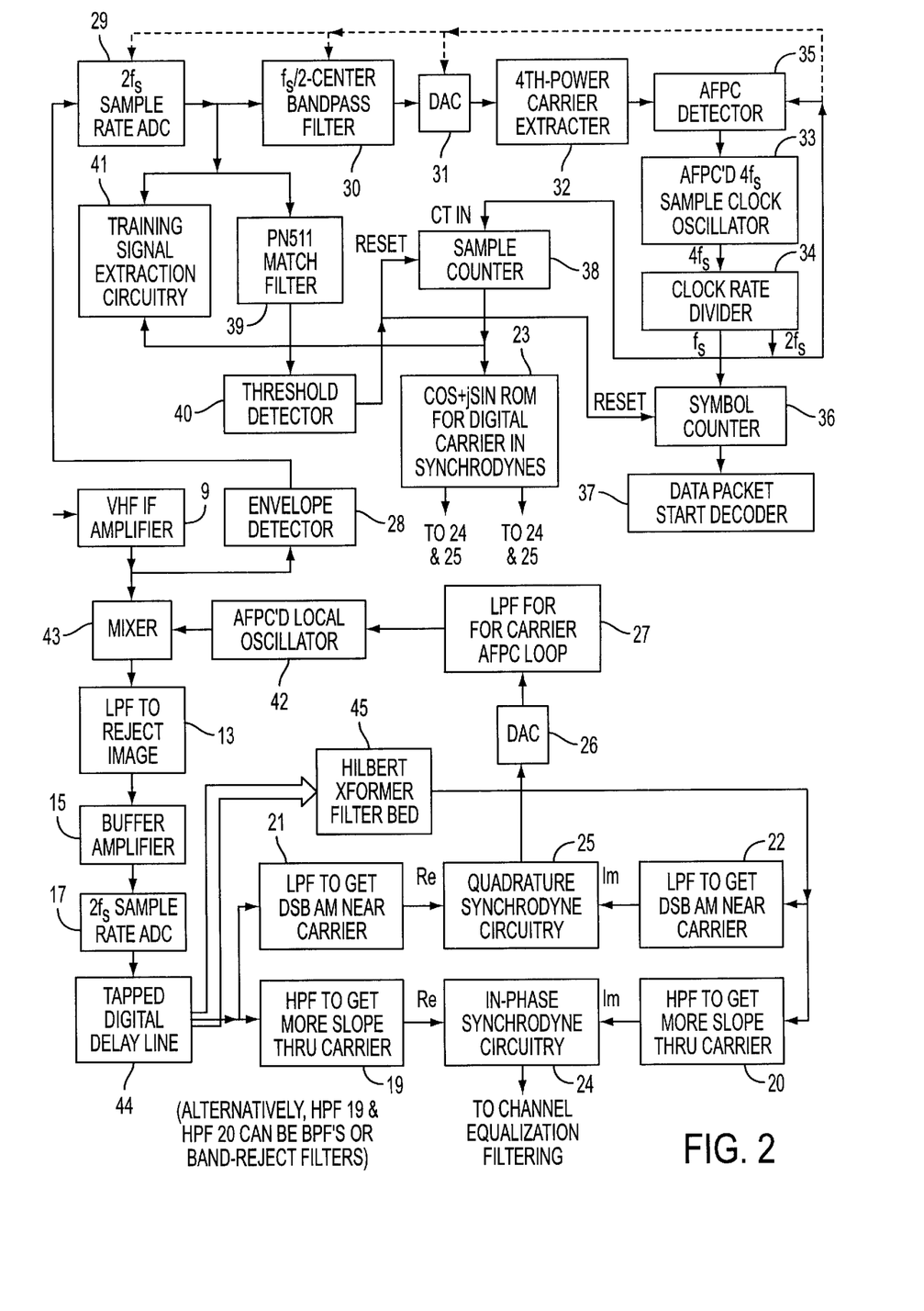
FIG. 2 is a block schematic diagram of portions of a vestigial-sideband digital television receiver embodying the invention, which VSB DTV receiver portions generate only a real final intermediate-frequency signal with a carrier at the lower end of its frequency spectrum, which final I-F signal is digitized and then is converted to a complex digital intermediate-frequency signal for subsequent demodulation in the digital regime.

FIG. 2 shows a modification of the FIG. 1 portions of a VSB DTV receiver which does not use the local oscillator 10 to supply complex local oscillations to the mixers 11 and 12 for generating complex final I-F signals. Rather, a local oscillator 42 supplies only real local oscillations to a mixer 43 for heterodyning with the VHF I-F amplifier 9 output signal to generate only real final I-F signals. These real final I-F signals are the input signal to the lowpass analog filter 13. The lowpass analog filter 14, the buffer amplifier 15 and the ADC 18 are not used in the FIG. 2 portions of a VSB DTV receiver. The output signal from the ADC 17 is supplied to a tapped digital delay line 44 as input signal thereto. An intermediate tap in the tapped digital delay line 44 supplies input signal to the digital highpass filter 19 and to the digital lowpass filter 21. The taps of the delay line 44 supply successive digital samples for weighted summation in a Hilbert transformer filter bed 45 that supplies input signal to the digital highpass filter 20 and to the digital lowpass filter 22.

Those skilled in the art of digital filter design will understand that digital filtering equivalent to that provided by the Hilbert transformer filter bed 45, the digital highpass filter 20, and the digital lowpass filter 22 is obtainable using different filter configurations. The Hilbert transformation and the highpass filtering equivalent to that of the digital highpass filter 20 can be provided in a unified digital filter structure that supplies its response to the buffer amplifier 15 output signal to the in-phase synchrodyning circuitry 24. The Hilbert transformation and the lowpass filtering equivalent to that of the digital lowpass filter 22 can be provided in a unified digital filter structure that supplies its response to the buffer amplifier 15 output signal to the quadrature-phase synchrodyning circuitry 25.

Figure 3:
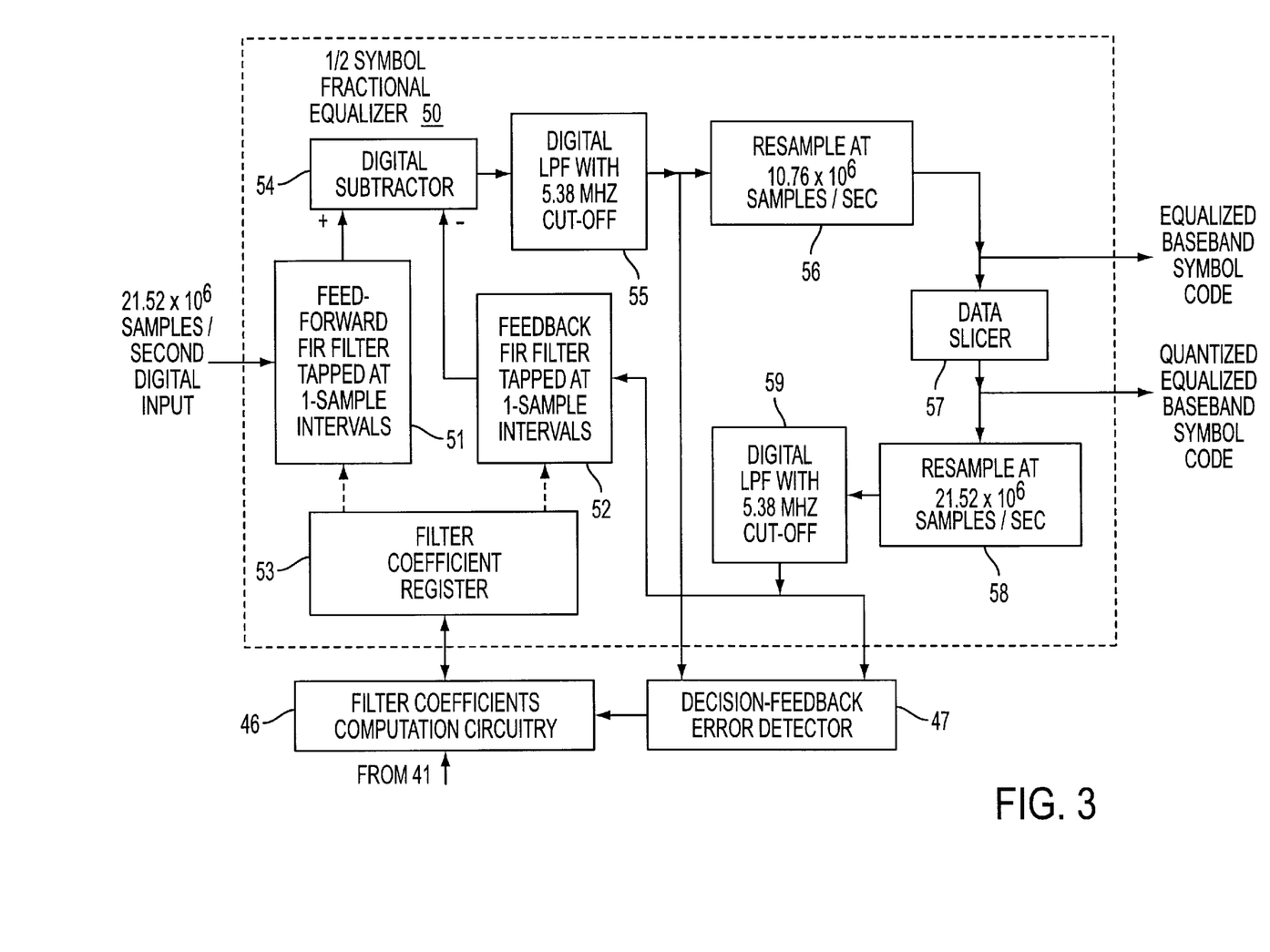
FIG. 3 is a schematic diagram of channel-equalization filtering that provides fractionally spaced equalization with one-half symbol epoch spacing between adjacent taps in the kernel of a component filter, which channel-equalization filtering is suited for use with the FIG. 1 or FIG. 2 portions of a VSB DTV receiver.

FIG. 3 shows a fractional equalizer 50 that provides channel-equalization filtering suitable for cascade connection after the FIG. 1 or FIG. 2 portions of a VSB DTV receiver. Adjacent taps in the kernel of a component filter in the equalizer 50 have spacing therebetween which corresponds to one-half of a symbol epoch. The fractional equalizer 50 receives, as its input signal, the sample stream supplied at a 21,524,476 samples-per-second rate from the FIG. 1 or FIG. 2 in-phase synchrodyne circuitry 24. A feed-forward FIR filter 51 and a feedback FIR filter 52 included in the fractional equalizer 50 are clocked and operated at the 21,524,476 samples-per-second rate, which sample rate is twice symbol rate, and have taps at one-sample intervals corresponding to one-half a symbol epoch. The filter coefficients for the FIR filters 51 and 52 are stored in a filter coefficient register 53 and are updated by filter coefficients computation circuitry 46 in response to decision feedback error signals supplied from a decision-feedback error detector 47. In embodiments of the invention employing blind adaptive equalization, the computation of the filter coefficients for the FIR filters 51 and 52 proceeds from initial filter coefficient values relying solely on decision-feedback error signals supplied by the error detector 47. However, as known, the processes for optimizing the filter coefficients proceed more rapidly if the initial filter coefficient values are determined from training signals extracted from training signal extraction circuitry 41 in the FIG. 1 or FIG. 2 portions of the VSB DTV receiver. The saving of filter coefficient values from the last time the channel currently selected for reception was being received to provide initial filter coefficient values is also known to help speed optimization of the filter coefficients for the FIR filters 51 and 52.

The fractional equalizer 50 further includes a digital subtractor 54 for differentially combining the responses from the FIR filters 51 and 52 at the 21,524,476 samples-per-second rate to supply equalized channel response in which equalization at band edges is improved over that obtainable using synchronous equalization. The difference output signal from the subtractor 54 is fed back to the input of the FIR filter 52, in a matter to be more particularly described infra. The resulting feedback loop incorporating the FIR filter 52 is operative as an infinite-impulse-response (IIR) filter used for suppressing multipath responses that appreciably lag the principal received DTV signal as demodulated to baseband. The feed-forward FIR filter 51 is used for suppressing multipath responses that lead the principal received DTV signal as demodulated to baseband. The feed-forward FIR filter 51 is also used for correcting errors in the amplitude and phase response of the reception channel introduced by the receiver or by multipath responses that slightly lead or lag the principal received DTV signal as demodulated to baseband.

The difference output signal from the subtractor 54 is reduced in sampling rate to symbol rate, to facilitate estimation of the symbol as transmitted. To effect the decimation, the difference output signal from the subtractor 54 is supplied to a lowpass digital finite-impulse-response filter 55 with 5.38 MHz cut-off frequency in its system response, and the filter 55 response is supplied to a (2:1 decimator) 56 for being re-sampled to a 10,762,238 samples-per-second sample rate that conforms to symbol rate. The symbol that was transmitted to give rise to the current sample of the re-sampler 56 response is estimated by supplying that current sample to a data slicer 57. The estimates of the transmitted symbol that the data slicer 57 generates are noise-free and most of the time are correct. So, the adaptation of the fractional equalizer 50 by decision-feedback procedures will usually converge more rapidly to optimum values of weighting coefficients if the input signal for the feedback FIR filter 52 is generated from these estimates, rather than using the difference output signal from the subtractor 54 as input signal for the feedback FIR filter 52.

An interpolation filter is required for converting these estimates, as generated at symbol rate, to the system sampling rate used by the digital subtractor 55 and by the FIR filters 51 and 52 that supply the minuend and subtrahend input signals to the subtractor 55. In FIG. 3 the interpolation filter comprises a re-sampler 58 for re-sampling the quantizer 57 response to 21,524,476 samples-per-second sampling rate and a finite-impulse-response digital lowpass filter 59 for restricting the bandwidth of the re-sampler 58 response. The lowpass filter 59 response is of appropriate 21,524,476 samples-per-second sampling rate for feeding back to the feedback FIR filter 52 of the fractional equalizer 50.

The FIR digital lowpass filter 55 is designed to cooperate with filtering in the transmitter to provide a raised-cosine filter response rolling off 6 dB at 5.38 MHz. This restriction of the bandwidth of the fractional equalizer 50 response avoids inter-symbol interference (ISI) in the re-sampler 56 response supplied to the data slicer 57. The data slicer 57 response is a series of estimates of the symbols transmitted by the broadcaster. This series of estimates is treated as an analog signal changing step value at one-symbol intervals, which equivalent analog signal has unlimited bandwidth when sampled at a multiple of symbol rate by the re-sampler 58. The FIR digital lowpass filter 59 provides a raised-cosine filter response to the re-sampled estimates, with a system frequency response rolling off 6 dB at 5.38 MHz. So, the estimated transmitted signal supplied from the filter 59 is suitable for comparison in the decision-feedback error detector 47 with the actual received signal supplied from the FIR digital lowpass filter 55. The FIR digital lowpass filter 55 response is delayed within the decision-feedback error detector 47 before the comparison with the FIR digital lowpass filter 59 response for generating decision-feedback error signal. The FIR digital lowpass filter 55 response is delayed before this comparison to compensate for the delays of the re-samplers 56 and 58, the delay of the quantizer 57, and difference in delays through the filters 55 and 59.

In a departure from the prior art, the decision-feedback error detector 47 is clocked at the 21,524,476 samples-per-second rate in order to preserve the digital bandwidth that the error detector 47 requires for generating decision-feedback error signal at this sample rate. Generating decision-feedback error signal at this sample rate that is higher than symbol rate is desirable when fractional equalization is employed, because of the tap spacings in the FIR filters 51 and 52 being less than one symbol epoch. The prior-art practice of generating decision-feedback error signal by comparing the data slicer 57 input and output signals at symbol rate introduces a restriction on the bandwidth of the decision-feedback error signal, considered as a system function, which restriction slows adaptation.

The response of the re-sampler 56 in the fractional equalizer 50 can be forwarded at symbol rate to trellis decoder circuitry of soft-decision type, such as a Viterbi decoder, in a subsequent portion of the DTV receiver. Or, the response of the data slicer 57 can be forwarded at symbol rate to trellis decoder circuitry of hard-decision type in a subsequent portion of the DTV receiver. Another possibility is to supply the response of the FIR digital lowpass filter 55 at the higher sampling rate to trellis decoder circuitry of soft-decision type in a subsequent portion of the DTV receiver.

In the fractional equalizer 50 operated at 21,524,476 samples-per-second clockthrough rate, the feedback FIR filter 52 must have at least 861 samples of delay in order to suppress post-ghosts with up to 40 microseconds delay respective to principal received signal. The feed-forward FIR filter 51 must have at least 64 samples of delay in order to suppress pre-ghosts that lead the principal received signal up to 3 microseconds, but is usually designed to have twice as many samples in its kernel to facilitate equalization. One-sample tap spacing in the filters 51 and 52 means that somewhere around 989 multipliers are used for applying the filter weights to the FIR filters 51 and 52 if straightforward design procedures are followed. The channel equalizer 50 of FIG. 3 can be modified to reduce by 430 or so the number of digital multipliers used therein, by replacing the feedback FIR filter 52 with a feedback FIR filter that is tapped at two-sample (one-symbol) intervals and has its tap weights calculated from decision feedback error detector 47 error signal as re-sampled to symbol rate. The modified structure is essentially a functional equivalent of the channel equalizer 50.

The ROM 23 used in the circuitry of FIGS. 1 and 2 differs from the complex-digital-carrier ROM used in the phase tracker described in U.S. Pat. No. 5,479,449 is that only one particular phasing of the complex carrier is stored, rather than several phasings. This provides a substantial saving in the storage capacity required of the complex-digital-carrier ROM. The ROM 23 used for generating the complex digital carrier needs to store a greater number of samples to describe one cycle of digital carrier at lower frequency. For example, with a 21,524,476 samples-per-second address rate, the ROM 23 has to store sixteen samples of a 1.345 megahertz digital carrier to describe a cycle thereof, but only has to store eight samples of a 1.345 megahertz digital carrier. Designs arranging for the carrier of the VSB DTV signal to appear in the upper frequencies of the complex final I-F signal, rather than in the lower frequencies, can further reduce the number of samples used to describe a cycle of digital carrier. However, there has to be more than two samples per cycle of digital carrier in order to support AFPC of the local oscillator 10. In most designs arranging for the carrier of the VSB DTV signal to appear in the upper frequencies of the complex final I-F signal, the system sampling rate is increased so at least four samples are used to describe a cycle of digital carrier.

Figure 4:
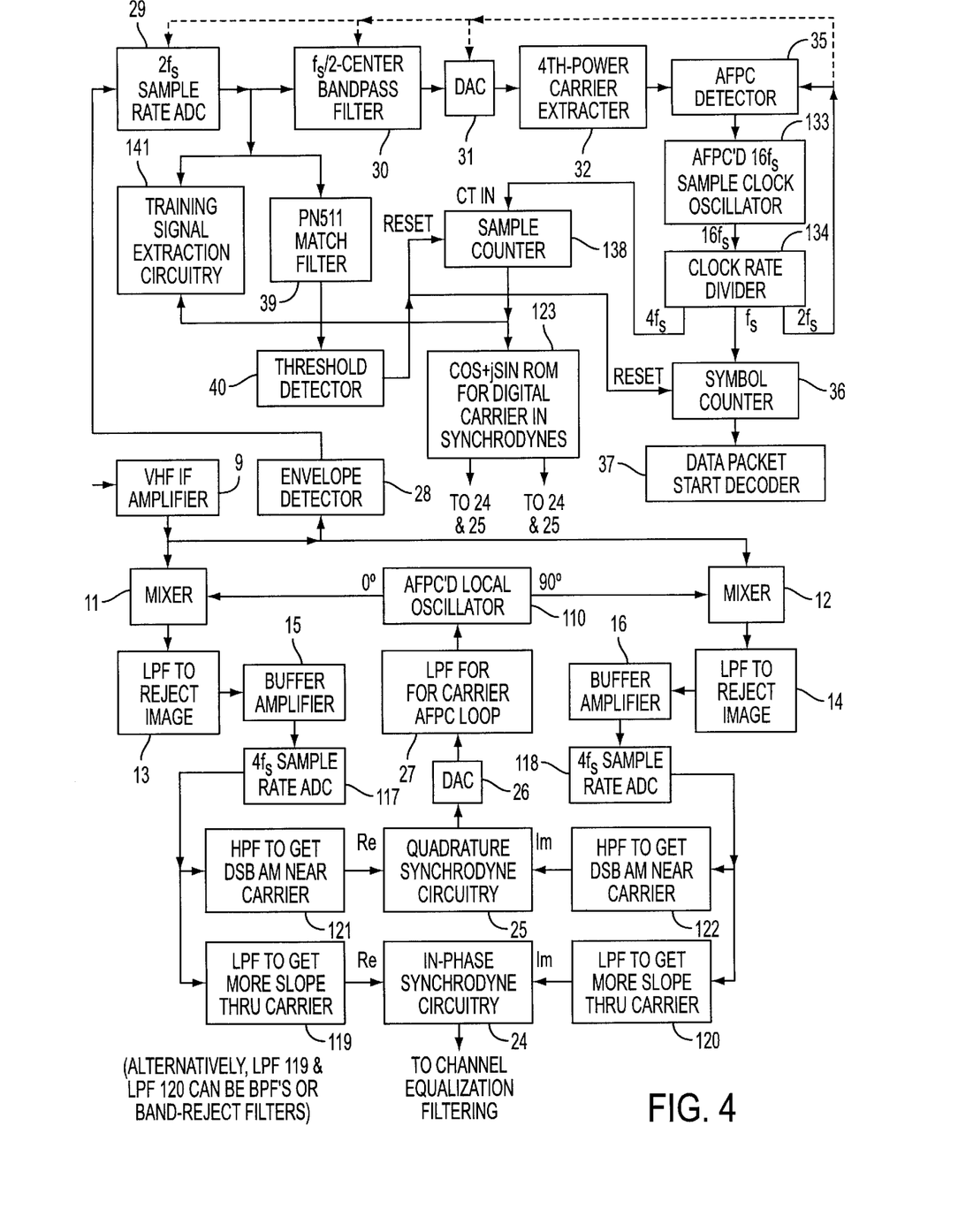
FIG. 4 is a block schematic diagram of portions of a vestigial-sideband digital television receiver embodying the invention, which VSB DTV receiver portions generate a complex final intermediate-frequency signal with a carrier at the upper end of its frequency spectrum, which final I-F signal is digitized by complex analog-to-digital conversion circuitry and is subsequently demodulated in the digital regime.

FIG. 4 shows portions of a VSB DTV receiver operated with a sampling clock of a frequency $4f_S$, which is four times the 10.76 Mhz symbol frequency $f_S$ used in the received VSB DTV signals. In FIG. 4 the very-high-frequency intermediate-frequency amplifier 9 supplies a VHF I-F output signal of controlled amplitude to the first mixer 11 and to the second mixer 12 for downconversion to a complex signal in a medium- and high-frequency band in the range of one to ten megahertz. A local oscillator 110 supplies an in-phase carrier at a frequency somewhat below the VHF I-F band to the first mixer 11 and a quadrature-phase carrier of the same frequency to the second mixer 12 for implementing this complex downconversion of the VHF I-F amplifier 9 output signal. The frequency and phase of the oscillations from this local oscillator 110 are subject to automatic frequency and phase control (AFPC). The AFPC of the oscillator 110 implements sampling of the VHF I-F signal at prescribed phases of the carrier when digitizing that VHF I-F signal.

The lowpass analog filters 13 and 14 select the components of this complex final intermediate-frequency signal from the output signals of the mixers 11 and 12, but suppress the image components in the complex signal. Buffer amplifiers 15 and 16 supply output signals to analog-to-digital converters 117 and 118 in response to the output signals of the filters 13 and 14. The ADCs 117 and 118 sample at the rate $4f_S$, which is four times the symbol rate $f_S$, and digitize the complex final I-F signal. It is presumed that the carrier of the VSB DTV signal appears in the upper frequencies of the complex final I-F signal supplied from the ADCs 117 and 118 in the FIG. 4 and FIG. 5 portions of a DTV receiver. A carrier frequency of 8.07 megahertz (three-fourths symbol rate) is convenient to use, for example, being easily synthesized from a ROM 123 that is addressed at a sample count made at four times symbol rate. Alternatively, by way of further example, a carrier frequency of 6.72 megahertz (five-eighths symbol rate) is quite readily synthesized from a ROM 123 that is addressed at a sample count made at four times symbol rate.

The digitized real and imaginary components of the complex final I-F signal supplied from the ADCs 117 and 118 are supplied to finite-impulse-response lowpass digital filters 119 and 120. The filters 119 and 120 are similar to each other in their construction and, in accordance with the invention, cut off the frequency responses to those components near and above carrier frequency in preparation for synchrodyning them to baseband for recovering baseband symbol code. The FIR digital lowpass filters 119 and 120 supply a complex final I-F signal, the real and imaginary components of which exhibit similar system characteristics with responses that are 3dB down at final I-F carrier frequency. The digital suppress noise at frequencies above the vestigial sideband that originates in the VHF I-F amplifier 9 and otherwise would accompany the complex final I-F signal supplied to the in-phase synchrodyne circuitry 24. Such noise would be synchrodyned to baseband where it would undesirably be superposed on baseband symbol coding. Designing the lowpass analog filters 13 and 14 with cut-off frequencies low enough to suppress the noise at frequencies above the vestigial sideband that originates in the VHF I-F amplifier 9 is difficult because uniform delay in phase response near the final I-F carrier is practically impossible to achieve. Linear phase response is achieved in FIR digital filtering simply by using symmetrical kernels. The spectrum folding that attends synchrodyning then tends to result in flat spectral response near zero frequency. This lessens the number of taps required in baseband channel equalization filtering to permit sufficient low-frequency adjustments to overcome the effects of non-uniform delay in phase response near the final I-F carrier.

The filters 119 and 120 can alternatively be designed as bandpass filters that have responses with Nyquist slope roll-offS that are 3 dB down at 5.38 MHz below final I-F carrier frequency. However, the filters 119 and 120 can be designed with fewer weighting coefficients if they are lowpass filters. Such design is possible if the Nyquist slope roll-offS are developed earlier in the DTV receiver (e. g., by SAW filter in the VHF I-F amplifier 9) or later in the DTV receiver (e. g., in the channel-equalization filtering, which is preferred).

The digitized real and imaginary components of the complex final I-F signal supplied from the ADCs 117 and 118 are supplied to finite-impulse-response digital highpass filters 121 and 122, which are similar to each other in their construction. The filters 121 and 122 generate responses to these real and imaginary components in which the amplitude-modulation sidebands are symmetrical around the 8.07 (or 6.72) megahertz carrier, over a frequency band wider than the lock in range of the APFC loop. That is, the modulation near carrier is DSB AM, so the responses to the upper and lower sidebands near carrier will cancel in the baseband response of the quadrature synchrodyne circuitry 25 from which AFPC signal for the local oscillator 110 is extracted. The system functions of the digital filters 121 and 122 are highpass, since the portions of a DTV receiver shown in FIG. 4 are designed to have the carrier of the VSB DTV signal appear in the upper frequencies of the complex final I-F signal supplied from the ADCs 117 and 118.

The complex digital carrier used for synchrodyning to baseband in the digital regime is supplied from the read-only memory 123 to the in-phase synchrodyne circuitry 24 and to the quadrature-phase synchrodyne circuitry 25. The in-phase synchrodyne circuitry 24 multiplies the responses of digital filters 119 and 120 by the complex digital carrier received from the ROM 123 to recover baseband symbol code as the real component of a complex product output signal. This baseband symbol code is forwarded to baseband channel-equalization and ghost-cancellation filter circuitry (e. g., of the type shown in FIG. 6).

The quadrature-phase synchrodyne circuitry 25 multiplies the responses of digital filters 119 and 120 by the complex digital carrier received from the ROM 123 to recover an imaginary component of the complex product output signal. The DAC 26 and the lowpass filter 27 extract the AFPC signal for the local oscillator 110 from this imaginary component of complex product output signal.

The latencies of the filters 121 and 122 are preferably the same as the latencies of the filters 119 and 120, with delay shimming being done if this is not the case. OffSetting the complex digital carriers supplied from the ROM 123 to the in-phase synchrodyne circuitry 24 and the quadrature-phase synchrodyne circuitry 25 is a possible alternative.

In FIG. 4 synchronization of the sampling circuitry to symbol rate of received VSB DTV signal is done independently of the bandpass tracker apparatus, using the spectral line method for passband signals, sometimes referred to as "envelope derived timing". Synchronization of the sampling circuitry is done similarly in FIGS. 1 and 4. In FIG. 4, however, the sample clock oscillator 33 and the clock rate divider network 34 are replaced by a sample clock oscillator 133 and a clock rate divider network 134. The sample clock oscillator 133 oscillates at $16f_S$ and supplies its oscillations to the clock rate divider network 134, which generates sampling clock signals at $4f_S$ sample rate as well as at $f_S$ sample rate and at $2f_S$ sample rate. The $2f_S$ sample rate signal from the clock rate divider network 134 is supplied to the AFPC detector 35 for comparison with the non-linear circuit 32 output signal. The non-linear circuit 32 output signal is a $2f_S$ signal that is the fourth power of the $f_S/2$ spectral line selected by the digital bandpass filter 30. The AFPC loop comprising elements 133, 134 and 35 locks the $2f_S$ sample rate signal from the clock rate divider network 134 in quadrature phase with the $2f_S$ output signal from the non-linear circuit 32 and adjusts the frequency and phase of the oscillator 133 oscillations to 16 $f_S$. The oscillator 133 is designed to oscillate at 16 $f_S$, rather than $8f_S$, better to avoid interference with channel 6 television broadcasting; and the clock rate divider network 134 is preferably of a design that avoids generation of significant energy at $8f_S$.

In FIG. 4 the $f_S$ sample rate signal from the clock rate divider network 134 is used as count input by the symbol counter 36; and the $2f_S$ sample rate signal from the clock rate divider network 134 is used for clocking the ADC 29, the digital bandpass filter 30, and the PN511 match filter 39.

The $4f_S$ sample rate signal from the clock rate divider network 134 is used for clocking the ADCs 117 and 118; the digital filters 119, 120, 121 and 122; the synchrodyning circuitry 24 and the synchrodyning circuitry 25. The $4f_S$ sample rate signal from the clock rate divider network 134 is also supplied to a sample counter 138 for counting the $4f_S$-rate samples in a prescribed number of data fields. Less significant bits of the count are used to address the ROM 123 that generates the complex digital carrier supplied to the synchrodyne circuitry 24 and to the synchrodyne circuitry 25.

FIG. 4, like FIG. 1, shows the envelope detector 28 response as digitized at $2f_S$ sample rate by the ADC 29 being supplied as input signal to the PN511 match filter 39. When a PN511 sequence occurs in the initial data segment of a data field, unless there is too much interfering noise the PN511 match filter 39 response will become large enough to be detected by a threshold detector 40 thereby generating a reset command for the counters 36 and 138. The counters 36 and 138 are designed to continue counting until such a reset command is supplied even if that takes a few data fields. The counters 36 and 138 are preferably designed to count samples for a plurality of data frames before the count rolls over, to implement the operation of training signal extraction circuitry 141. The training signal extraction circuitry 141 of FIG. 4 operates similarly to the training signal extraction circuitry 41 of FIG. 1, except for the extracted training signal being re-sampled to $4f_S$ sample rate for application to filter coefficients computation circuitry 146 associated with the FIG. 6 channel-equalization filtering.

Figure 5:
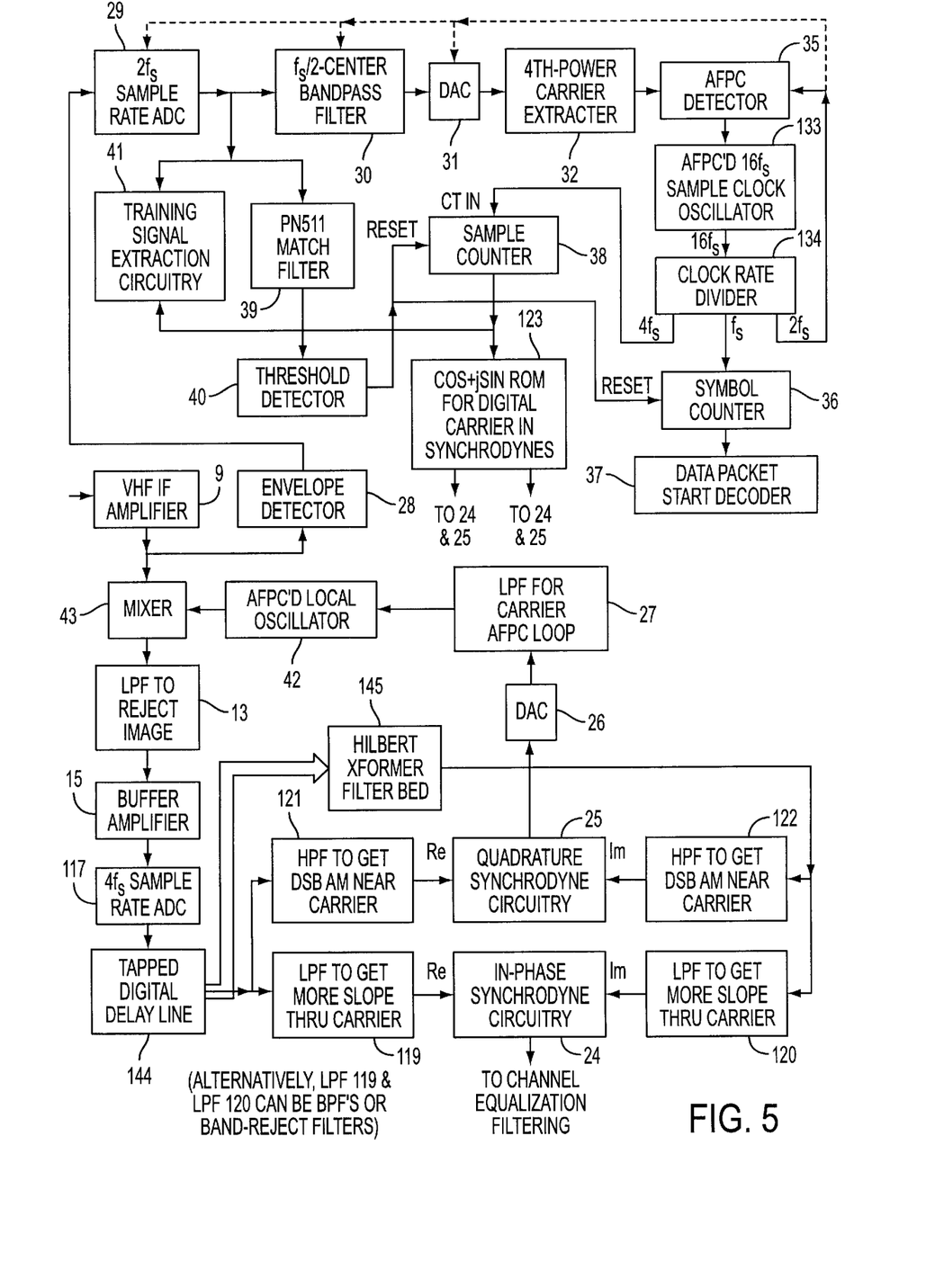
FIG. 5 is a block schematic diagram of portions of a vestigial-sideband digital television receiver embodying the invention, which VSB DTV receiver portions generate only a real final intermediate-frequency signal with a carrier at the upper end of its frequency spectrum, which final I-F signal is digitized and then is converted to a complex digital intermediate-frequency signal for subsequent demodulation in the digital regime.

FIG. 5 shows a modification of the FIG. 4 portions of a VSB DTV receiver which does not use the local oscillator 110 to supply complex local oscillations to the mixers 11 and 12 for generating complex final I-F signals. Rather, a local oscillator 142 supplies only real local oscillations to the mixer 43 for heterodyning with the VHF I-F amplifier 9 output signal to generate only real final I-F signals. These real final I-F signals are the input signal to the lowpass analog filter 13. The lowpass analog filter 14, the buffer amplifier 16 and the ADC 118 are not used in the FIG. 5 portions of a VSB DTV receiver. The output signal from the ADC 117 is supplied to a tapped digital delay line 144 as input signal thereto. An intermediate tap in the tapped digital delay line 114 supplies input signal to the digital lowpass filter 119 and to the digital highpass filter 121. The taps of the delay line 144 supply successive digital samples for weighted summation in a Hilbert transformer filter bed 145 that supplies input signal to the digital lowpass filter 120 and to the digital highpass filter 122.

Those skilled in the art of digital filter design will understand that digital filtering equivalent to that provided by the Hilbert transformer filter bed 145, the digital lowpass filter 120, and the digital highpass filter 122 is obtainable using different filter configurations. The Hilbert transformation and the lowpass filtering equivalent to that of the digital lowpass filter 120 can be provided in a unified digital filter structure that supplies its response to the buffer amplifier 15 output signal to the in-phase synchrodyning circuitry 24. The Hilbert transformation and the highpass filtering equivalent to that of the digital highpass filter 122 can be provided in a unified digital filter structure that supplies its response to the buffer amplifier 15 output signal to the quadrature-phase synchrodyning circuitry 25.

Figure 6:
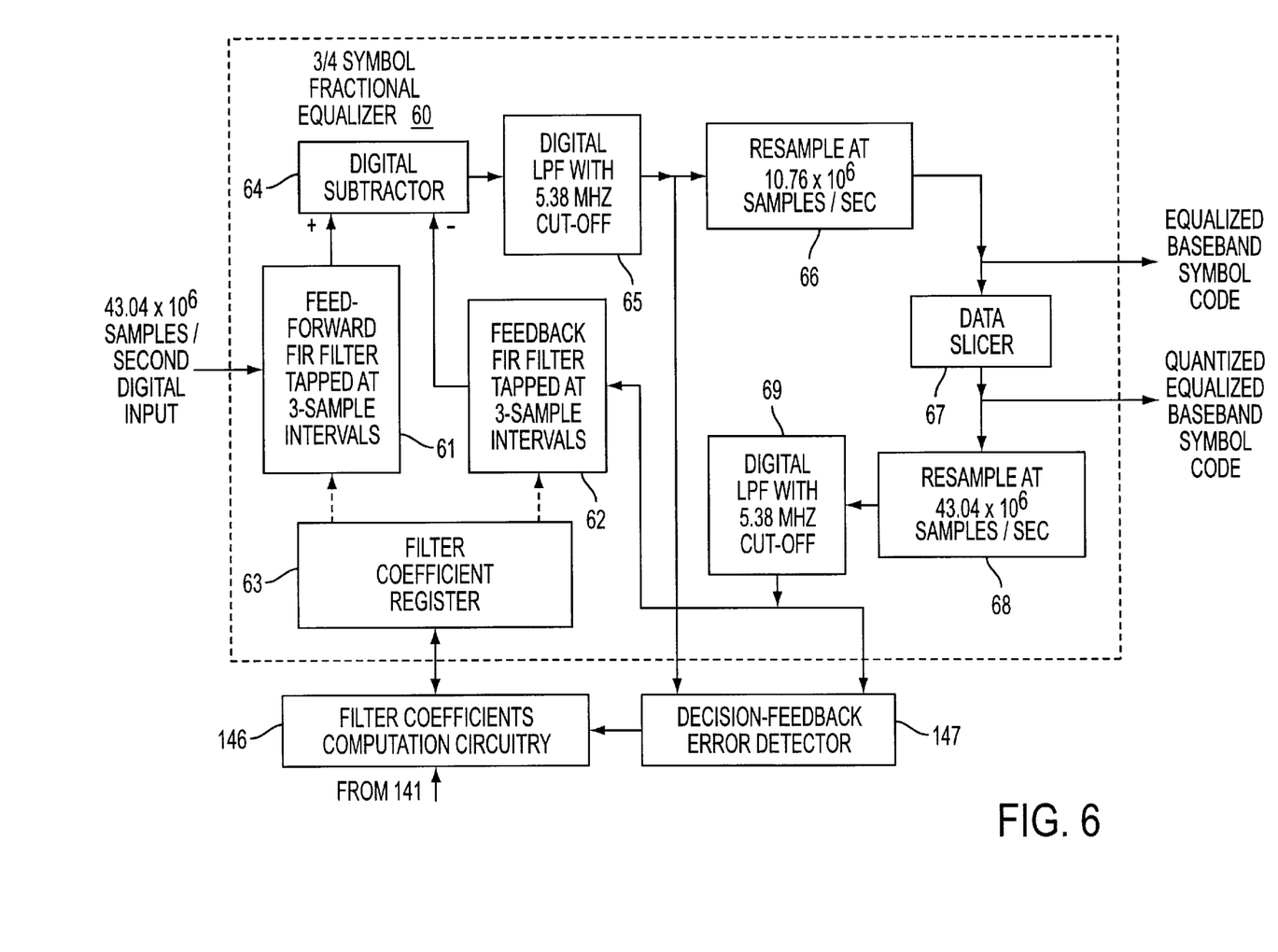
FIG. 6 is a schematic diagram of channel-equalization filtering that provides fractionally spaced equalization with three-fourths symbol epoch spacing between adjacent taps in the kernel of a component filter, which channel-equalization filtering is suited for use with the FIG. 4 or FIG. 5 portions of a VSB DTV receiver.

FIG. 6 shows a fractional equalizer 60 that provides channel-equalization filtering suitable for cascade connection after the FIG. 4 or FIG. 5 portions of a VSB DTV receiver. The fractional equalizer 60 receives, as its input signal, the sample stream supplied at a 43,048,951 samples-per-second rate from the FIG. 4 or FIG. 5 in-phase synchrodyne circuitry 24. A feed-forward FIR filter 61 and a feedback FIR filter 62 included in the fractional equalizer 60, are clocked and operated at the 43,048,951 samples-per-second rate, which sample rate is four times symbol rate, and have taps at three-sample intervals corresponding to three-quarters of a symbol epoch. The filter coefficients for the FIR filters 61 and 62 are stored in a filter coefficient register 63 and are updated by filter coefficients computation circuitry 146 in response to decision feedback error signals supplied from a decision-feedback error detector 147. In embodiments of the invention employing blind adaptive equalization, the computation of the filter coefficients for the FIR filters 61 and 62 proceeds from initial filter coefficient values relying solely on decision-feedback error signals supplied by the error detector 147. However, as known, the processes for optimizing the filter coefficients proceed more rapidly if the initial filter coefficient values are determined from training signals extracted from training signal extraction circuitry 141 in the FIG. 4 or FIG. 5 portions of the VSB DTV receiver. The saving of filter coefficient values from the last time the channel currently selected for reception was being received to provide initial filter coefficient values is also known to help speed optimization of the filter coefficients for the FIR filters 61 and 62.

The fractional equalizer 60 further includes a digital subtractor 64 for differentially combining the responses from the FIR filters 61 and 62 at the 43,048,951 samples-per-second rate to supply equalized channel response in which equalization at band edges is improved over that obtainable using synchronous equalization. The difference output signal from the subtractor 64 is fed back to the input of the FIR filter 62, in a matter to be more particularly described infra. The resulting feedback loop incorporating the FIR filter 62 is operative as an IIR filter used for suppressing multipath responses that appreciably lag the principal received DTV signal as demodulated to baseband. The feed-forward FIR filter 61 is used for suppressing multipath responses that lead the principal received DTV signal as demodulated to baseband. The feed-forward FIR filter 61 is also used for correcting errors in the amplitude and phase response of the reception channel introduced by the receiver or by multipath responses that slightly lead or lag the principal received DTV signal as demodulated to baseband.

The difference output signal from the subtractor 64 is-reduced in sampling rate to symbol rate, to facilitate estimation of the symbol as transmitted. To effect the decimation, the difference output signal from the subtractor 64 is supplied to a lowpass digital finite-impulse-response filter 65 with 5.38 MHz cut-off frequency in its system response, and the filter 65 response is supplied to a re-sampler (4:1 decimator) 66 for being re-sampled to a 10,762,238 samples-per-second sample rate that conforms to symbol rate. The symbol that was transmitted to give rise to the current sample of the re-sampler 66 response is estimated by supplying that current sample to a data slicer 67. The estimates of the transmitted symbol that the data slicer 67 generates are noise-free and most of the time are correct. So, the adaptation of the fractional equalizer 60 by decision-feedback procedures will usually converge more rapidly to optimum values of weighting coefficients if the input signal for the feedback FIR filter 62 is generated from these estimates, rather than using the difference output signal from the subtractor 64 as input signal for the feedback FIR filter 62.

An interpolation filter is required for converting these estimates, as generated at symbol rate, to the system sampling rate used by the digital subtractor 64 and by the FIR filters 61 and 62 that supply the minuend and subtrahend input signals to the subtractor 64. In FIG. 6 the interpolation filter comprises a re-sampler 68 for re-sampling the quantizer 67 response to 43,048,951 samples-per-second sampling rate and a finite-impulse-response digital lowpass filter 69 for restricting the bandwidth of the re-sampler 68 response. The lowpass filter 69 response is of appropriate 43,048,951 samples-per-second sampling rate for feeding back to the feedback FIR filter 62 of the fractional equalizer 60.

The FIR digital lowpass filter 65 is designed to cooperate with filtering in the transmitter to provide a raised-cosine filter response rolling off 6 dB at 5.38 MHz in the frequency domain. This restriction of the bandwidth of the fractional equalizer 60 response avoids ISI in the re-sampler 66 response supplied to the data slicer 67. The data slicer 67 response is a series of estimates of the symbols transmitted by the broadcaster. This series of estimates is treated as an analog signal changing step value at one-symbol intervals, which equivalent analog signal has unlimited bandwidth when sampled at a multiple of symbol rate by the re-sampler 68. The FIR digital lowpass filter 69 provides a raised-cosine filter response to the re-sampled estimates, with a system frequency response rolling off 6 dB at 5.38 MHz. So, the estimated transmitted signal supplied from the filter 69 is suitable for comparison in the decision-feedback error detector 147 with the actual received signal supplied from the FIR digital lowpass filter 65. The FIR digital lowpass filter 65 response is delayed within the decision-feedback error detector 147 before the comparison with the FIR digital lowpass filter 69 response for generating decision-feedback error signal. The FIR digital lowpass filter 65 response is delayed before this comparison to compensate for the delays of the re-samplers 66 and 68, the delay of the quantizer 67, and difference in delays through the filters 65 and 69.

The decision-feedback error detector 147 is clocked at the 43,048,951 samples-per-second rate in order to preserve the digital bandwidth that the error detector 147 requires for generating decision-feedback error signal at this sample rate. Generating decision-feedback error signal at this sample rate that is higher than symbol rate is desirable because of the tap spacings in the FIR filters 61 and 62 being only three-quarters of a symbol epoch.

The response of the re-sampler 66 in the fractional equalizer 60 can be forwarded at symbol rate to trellis decoder circuitry of soft-decision type, such as a Viterbi decoder, in a subsequent portion of the DTV receiver. Or, the response of the data slicer 67 can be forwarded at symbol rate to trellis decoder circuitry of hard-decision type in a subsequent portion of the DTV receiver. Another possibility is to supply the response of the FIR digital lowpass filter 65 at the higher sampling rate to trellis decoder circuitry of soft-decision type in a subsequent portion of the DTV receiver.

In the fractional equalizer 60 operated at 43,048,951 samples-per-second clockthrough rate, the feedback FIR filter 62 must have at least 1722 samples of delay in order to suppress post-ghosts with up to 40 microseconds delay respective to principal received signal. The feed-forward FIR filter 61 must have at least 128 samples of delay in order to suppress pre-ghosts that lead the principal received signal up to 3 microseconds, but is usually designed to have twice as many samples in its kernel to facilitate equalization. Three-sample tap spacing in the filters 61 and 62 means that somewhere around 660 multipliers are used for applying the filter weights to the FIR filters 61 and 62 if straightforward design procedures are followed. The channel equalizer 60 of FIG. 6 can be modified to reduce by 144 or so the number of digital multipliers used therein, by replacing the feedback FIR filter 62 with a feedback FIR filter that is tapped at four-sample (one-symbol) intervals and has its tap weights calculated from decision feedback error detector 147 error signal as re-sampled to symbol rate. The modified structure is essentially a functional equivalent of the channel equalizer 60.

Modification of the FIG. 1 or 2 portions of the DTV receiver to employ bandpass filters for rolling off carrier frequency response 3 dB in the DTV receiver, rather than using the highpass filters 19 and 20 for such purpose, generates further embodiments of the invention. The bandpass filters should pass modulation components at least up to 5.38 MHz above the carrier frequency of the final I-F signal.

Modification of the FIG. 1 or 2 portions of the DTV receiver to employ band-reject filters for rolling off carrier frequency response 3 dB in the DTV receiver, rather than using the highpass filters 19 and 20 for such purpose, generates further embodiments of the invention. The band-reject nulls are located below the carrier frequency of the final I-F signal.

Modification of the FIG. 4 or 5 portions of the DTV receiver to employ bandpass filters for rolling off carrier frequency response 3 dB in the DTV receiver, rather than using the lowpass filters 119 and 120 for such purpose, generates further embodiments of the invention. The bandpass filters should pass modulation components 5.38 MHz or more below the carrier frequency of the final I-F signal.

Modification of the FIG. 4 or 5 portions of the DTV receiver to employ band-reject filters for rolling off carrier frequency response 3 dB in the DTV receiver, rather than using the lowpass filters 119 and 120 for such purpose, generates further embodiments of the invention. The band-reject nulls are located above the carrier frequency of the final I-F signal.

What is claimed is:

1. A radio signal receiver for vestigial sideband digital television signals, said receiver comprising a tuner for converting the vestigial-sideband amplitude modulation of a selected digital radio signal to an analog intermediate-frequency signal;

analog-to-digital conversion circuitry for converting said analog intermediate-frequency signal to a digitized intermediate-frequency signal;

a digital filter for generating a shaped spectral response to said digitized intermediate-frequency signal;

in-phase synchrodyning circuitry for demodulating said digitized intermediate-frequency signal to recover baseband symbol coding; and adaptive baseband equalization and ghost-cancellation filtering responsive to the baseband symbol coding recovered by said in-phase synchrodyning circuitry, wherein the shaped spectral response of said digital filter is designed to improve the flatness of amplitude response and uniformity of group delay of components of said baseband symbol coding that are close to zero frequency, thereby to relieve said adaptive baseband equalization and ghost-cancellation filtering from having to provide such improvements.

2. The radio signal receiver of claim 1, wherein said analog intermediate-frequency signal has a carrier at the lower end of its frequency spectrum, and wherein said digital filter is of a type for generating said shaped spectral response that is highpass in nature.

3. The radio signal receiver of claim 1, wherein said analog intermediate-frequency signal has a carrier at the lower end of its frequency spectrum, and wherein said digital filter is of a type for generating said shaped spectral response that is bandpass in nature.

4. The radio signal receiver of claim 1, wherein said analog intermediate-frequency signal has a carrier at the lower end of its frequency spectrum, and wherein said digital filter is of a type for generating said shaped spectral response that is band-reject in nature.

5. The radio signal receiver of claim 1, wherein said analog intermediate-frequency signal has a carrier at the upper end of its frequency spectrum, and wherein said digital filter is of a type for generating said shaped spectral response that is lowpass in nature.

6. The radio signal receiver of claim 1, wherein said analog intermediate-frequency signal has a carrier at the upper end of its frequency spectrum, and wherein said digital filter is of a type for generating said shaped spectral response that is bandpass in nature.

7. The radio signal receiver of claim 1, wherein said analog intermediate-frequency signal has a carrier at the upper end of its frequency spectrum, and wherein said digital filter is of a type for generating said-shaped spectral response that is band-reject in nature.

* * * * *